United States Patent [19]
Enabnit

[11] 4,084,135
[45] Apr. 11, 1978

[54] SYSTEM AND METHOD FOR CHECKING THE SENSITIVITY AND PERFORMANCE OF AN ELECTROMAGNETIC FIELD VARIATION DETECTOR

[75] Inventor: Robert S. Enabnit, Akron, Ohio

[73] Assignee: The Goodyear Tire & Rubber Company, Akron, Ohio

[21] Appl. No.: 758,269

[22] Filed: Jan. 10, 1977

Related U.S. Application Data

[63] Continuation-in-part of Ser. No. 607,519, Aug. 25, 1975, abandoned, which is a continuation-in-part of Ser. No. 452,019, Mar. 18, 1974, abandoned.

[51] Int. Cl.² .............................................. G01R 33/12
[52] U.S. Cl. .................................... 324/202; 324/239
[58] Field of Search ............................. 324/34 R, 41

[56] References Cited
U.S. PATENT DOCUMENTS

| | | | |
|---|---|---|---|
| 2,942,178 | 6/1960 | Nerwin | 324/34 R |
| 3,408,493 | 10/1968 | Westover et al. | 324/41 |
| 3,652,928 | 3/1972 | Mansfield | 324/41 |

Primary Examiner—Robert J. Corcoran
Attorney, Agent, or Firm—L. A. Germain

[57] ABSTRACT

At periodic intervals a timer initiates a short duration pulse from a one-shot that changes the state of a flip-flop functioning to deactivate a status indicator. The one-shot pulse also activates a driver circuit that energizes an inductive test coil positioned within the province of an electromagnetic field generated by a field variation detector. The variance in the field created by the test coil is sensed by the detector receiver which shapes and modifies the response in accordance with the characteristics of the detection circuitry and the duration of the one-shot pulse. The characteristic of the modified pulse waveform is gated back to the flip-flop that switches states to reactivate the status indicator to its original indication. A change in the detector sensitivity and/or performance will effect a modified pulse waveform exhibiting a characteristic different from that required to reset the circuitry and thus an abnormal operation is indicated.

8 Claims, 1 Drawing Figure

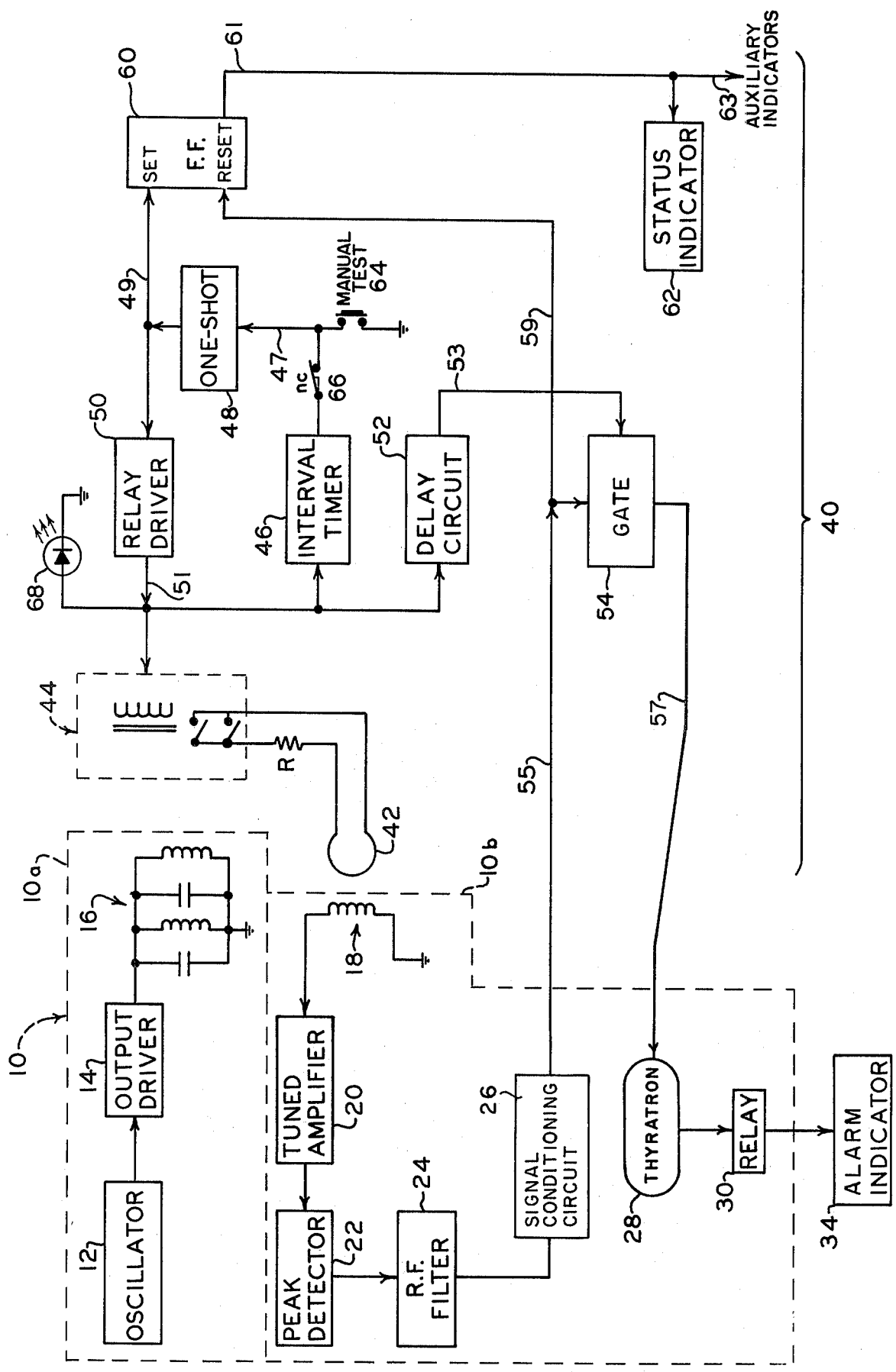

SYSTEM AND METHOD FOR CHECKING THE SENSITIVITY AND PERFORMANCE OF AN ELECTROMAGNETIC FIELD VARIATION DETECTOR

BACKGROUND OF THE INVENTION

This application is a continuation-in-part of application Ser. No. 607,519 filed Aug. 25, 1975, which is a continuation-in-part of application Ser. No. 452,019 filed Mar. 18, 1974, both of which are now abandoned.

This invention concerns detectors for sensing variations in an electromagnetic field and more specifically to a method and apparatus for periodically and automatically checking the performance and sensitivity of an on-line field variation detector, and further, to continuously indicate the status of the detector and checking circuitry without affecting normal operation.

Electromagnetic field detectors are applied to many and various applications wherein it is desired to monitor the condition or state of a specific operation. Generally, in monitoring-type applications, normal operation will not affect the existing electromagnetic field while an abnormality in the operation adversely affects the field such that a warning indication may be generated and corrective action initiated.

Alternatively, in some instances, the monitoring system is arranged such that in the normal condition the field is periodically affected while the absence of a change in the field is indicative of an abnormal condition occurrence. In either case, system monitoring is accomplished by sensing the variations in an electromagnetic field.

In detectors of this type, the sensitivity must be maintained to insure effective monitoring for a specific condition occurrence. For example, in the application to metal detection, the detector sensitivity is established with reference to a minimum standard sample mass of metal to be detected. Should the sensitivity of the detector drop for some reason, metal pieces of a size greater than the minimum standard will pass undetected and the system effectiveness is drastically reduced.

It is the practice within the prior art to provide apparatus for checking the sensitivity of the detector by periodically altering the detector field in a predetermined manner and sensing for the test signal as it relates to a minimum amplitude level that may be passed by the detector. In this circumstance, a status indication will be given as long as the signal has a specific amplitude level. These type detector checking systems, however, do not distinguish signals by any other characteristic and therefore are subject to giving false system shutdowns when signals are passed that are generated by external influences within the environment of the detection apparatus. These externally influenced signals contain all the frequency components of the test signal and therefore are passed as valid detection signals.

A prior art detection system that discriminates from these false signals is taught in U.S. Pat. No. 3,949,293 issued Apr. 6, 1976, and assigned to The Goodyear Tire & Rubber Company, Akron, Ohio. In this system, signals indicative of a detected mass of material are related to a selected mass velocity and detection aperture through which the mass is moved. The pulse output signal generated by the variation in the electromagnetic field is conditioned and enhanced by the detector as a valid signal while all others due to noise, etc., are rejected being outside of a selected threshold for the particular mass velocity and aperture length. Thus, the detector aperture is the field configuration that establishes a pulse duration unique to the desired mass moving at a constant velocity through the detector.

It is therefore an object of this invention to provide checking circuitry for an electromagnetic field variation detector that determines that the characteristic pulse duration of the signal being processed by the detector is as required for peak detector sensitivity and peformance rather than just its absence or presence as is customary in the prior art.

Another object of the invention is to provide apparatus that is fail-safe and continuously indicates the status of both detection and checking systems.

Still another object of the invention is to provide a system that uses all of the detector's own circuitry in the sensitivity test without affecting its normal field variation detection.

The beforementioned objects and other objects and advantages of the invention will become evident from the detailed description that follows taken in conjunction with the accompanying drawing, and which are provided in a sensitivity and performance checking system for an electromagnetic field variation detector comprising, (a) a normally open-circuited coil positioned within the field generated by the detector, (b) means for indicating the normal/abnormal status of the system, and (c) circuit means for generating periodic short duration pulses to deactivate the status indicating means and close-circuit the test coil such that a field variation signal is effected by the test coil energization that may be sensed and conditioned by the detector and gated back to reactivate the indicating means wherein the status of the indicating means is indicative of the detector operation and sensitivity and the condition of the checking system.

DESCRIPTION OF THE DRAWING

The accompanying drawing is a block circuit diagram illustrating the invention as it may be applied to an electromagnetic field variation detector.

DESCRIPTION OF THE INVENTION

For the purpose of aiding in the description and not for limiting same, the invention will be described with respect to a field variation detector as applied to metal detection applications.

In the drawing, a metal detector is generally indicated by numeral 10. The particular detector shown is an I.T.T. Model No. MD-1225A and conventionally comprises a field generator or transmitter section 10a and a receiver section 10b. Transmitter section 10a comprises an oscillator 12 feeding into an output driver circuit 14 that connects to a double tuned circuit 16. Receiver section 10b comprises a pickup coil 18 feeding into a tuned amplifier 20 that provides an output signal in response to a field unbalance effected by the proximate presence of foreign metal within the field generated by transmitter 10a. The output from amplifier 20 is processed through a peak detector 22, an RF filter 24, and a signal conditioning circuit 26 that demodulates, amplifies, and otherwise conditions the unbalance signal in accordance with the teaching of U.S. Pat. No. 3,949,293. The conditioned unbalance signal would normally be applied to a thyratron 28 that energizes a relay circuit 30 when the unbalance signal exceeds the threshold value of the thyratron and the relay circuit provides a signal to a metal alarm indicator 34. The detector 10 would normally be positioned to monitor a moving conveyor for the presence of unwanted metal. In this type application the detector sensitivity is adjusted according to a desired minimum unbalance in the generated field that may be detected. To do this, a standard sample of a specific mass of metal is periodically put on the conveyor and passed proximate to the generated field and the detector is adjusted to sense the unbalance in the field due to the sample. Thus, the presence of metal less than the standard sample will not unbalance the field sufficiently to effect a signal in the receiver section 10b.

To accomplish monitoring of the detector sensitivity automatically and without resort to interruption of the normal operation by the standard sample method described above, a sensitivity and performance checking system is installed according to the teaching of the instant invention. This system is generally indicated by reference numeral 40 and includes a normally open-circuited inductive loop or coil 42 positioned within the fringe area of the field generated by detector 10. The open-circuited coil is connected to a relay or other equivalent switching device 44 such that when the circuit is closed an unbalance of the field is achieved similar to that provided by unwanted metal. By balancing the detector with the open-circuited coil in place, the coil is ignored in a normal detection process. The size, position, or a series resistance R may be used to adjust the coil when close-circuited to provide a signal level corresponding to the minimum metal mass desired to be detected, or any other sensitivity threshold.

To establish automatic checking, a timing circuit is provided which comprises a timer 46 connected to a one-shot 48 via line 47. The one-shot provides a pulse output signal on line 49 to set the state of a flip-flop 60, while a relay driver circuit 50, also on line 49, follows the one-shot pulse to effect energizing a switching circuit via line 51. The signal appearing on line 51 is fed back to the timer 46 as a reset and also to a delay circuit 52. The delay circuit is coupled to activate a gate 54 via line 53. Coupling of the checking system into the detector is accomplished by feeding the conditioned and modified output pulse signal from the detector conditioning circuit 26 to the gate 54 via line 55 and returning it to the thyratron 28 via line 57. The conditioned output 55 from circuit 26 is also fed into the flip-flop 60 as a "reset" via line 59. The flip-flop is coupled via an output line 61 to a status indicating circuit 62 or other auxiliary monitoring equipment that may be deemed desirable connected at 63.

Operation of the system in conjunction with a typical field variation detector as exemplified by the I.T.T. unit shown in the drawing, will now be described. First, assume that the status indicator 62 is providing a lighted display for an "O.K." or "condition normal" indication by virtue of the initial status of flip-flop 60. Second, assume that the gate 54 is "open" such that normal field unbalance detection signals are shunted to line 57 and the thyratron 28. To initiate a test, timer 46 activates the one-shot 48 such that a pulse is provided on line 49. This pulse switches the state of the flip-flop such that the status indicator connected to line 61 is switched to its "off" indication. Simultaneously, the relay driver 50 follows the state of the one-shot and applies a signal to activate the switching circuit 44, thus close-circuiting the test coil 42 for the period of the one-shot pulse. The energized coil provides a field unbalance that is sensed by the detector receiver circuit 10b that conditions and modifies the signal according to the detector circuit characteristic and pulse duration in the same manner that it does for a field unbalance due to unwanted metal. If the sensitivity of the detector 10 is within tolerance and all existing circuitry are performing properly, then a corresponding signal, characteristic of the detector conditioning, will appear on line 55. However, if the sensitivity and/or performance have dropped for some reason, no signal or a signal exhibiting a changed characteristic waveform will appear on line 55.

The signal that is applied to activate the switching circuit 44 is simultaneously applied to the timer 46 and the delay circuit 52. The timer is thus reset for the next test sequence to be initiated according to the timer period chosen. The delay circuit responds by immediately holding the gate 54 closed to line 57 so that the signal due to the close-circuited coil 42 is not shunted to the thyratron. The gate is held closed by the delay circuit for a subsequent period after deactivation of the switch 44 to allow for the detector receiver conditioning circuitry to return to normal quiescence. During this interval, determined by the actual test period and the delay circuit 52, the unbalance signal due to the coil 42 can appear only on line 59 to the flip-flop 60. This signal, when applied to the flip-flop 60, resets the flip-flop and the status indicator is switched back to its original "O.K." indication only if the performance of the detector 10 is within tolerance. Should the operation of the detector be out of tolerance such that the signal on line 55 is either absent or characteristically changed, then the flip-flop 60 will not be reset and the status indicator will not revert to its original normal condition indication. Thus, the abnormal condition is recognized. After the delay period has elapsed, gate 54 is again opened to line 57 so that the normal detection process continues.

Pulses provided by the one-shot 48, in response to the signal on line 47, are of a duration and power required to force a change in the state of the flip-flop 60 and relay driver 50. The field unbalance created by the close-circuited coil 42, which establishes a change to simulate the presence of metal, is maintained for the period of the one-shot pulse after which the coil energization is terminated.

In this respect, the duration of a pulse from the one-shot 48 is substantially the period associated with metal passing through the detector head but is shorter than the period between successive metal detection pulses. For example, the one-shot may be adjusted to provide an 0.2 second duration pulse at intervals of 5 minutes as established by the interval timer 46. Close-circuiting of the switch 44 for the 0.2 second pulse duration establishes a field unbalance that is detectable by the receiver 10b if the signal processing capability of the receiver has not changed. This signal is conditioned and modified in the receiver 10b in the same manner as detection signals due to metal and a characteristic signal is output on line 55. A signal which is not processed in the detector in accordance with the one-shot pulse duration, does nor reset the flip-flop and the indicator 62 remains in the "off" condition indicating abnormal operation. Upon termination of the one-shot pulse, however, the relay driver 50 is caused to terminate the test coil energization and thus, a continuous self-controlled loop operation is achieved through the flip-flop when the signal is properly processed while the one-shot provides a test signal turn-off independent of the loop. The delay circuit 52 maintains the gate 54 closed a short time after the relay driver removes power from the test coil thereby assuring recovery to normal operating conditions before returning to a metal detection indication.

That the system is "fail-safe" is illustrated by the following:

(A) a malfunction in the detector field generator 10a or receiver 10b will maintain the status indicator 62 in an abnormal indication because the flip-flop will not be reset;

(B) a change in detector operation will cause the test coil to go undetected and the status indicator will also indicate this condition; and (C) a malfunction in the checking system will be indicated by either status indicator 62 or LED 68.

While the system is "fail-safe", the normal operation of the detector 10 is not affected since normal detection signals are gated back for a detection indication via line 57.

The status indicator 62 may be chosen to give any type audio or visual indication. For example, a single lamp may be lit in the normal detector sequence and will be turned "off" at the start of a test period by a pulse from the one-shot on line 49 to the flip-flop 60. The appearance of a properly conditioned test signal on line 59 to reset the flip-flop will turn the lamp "on" again to indicate the system is operating normally. Should the lamp not be turned "on" then it will be apparent that the system is not functioning properly. The test indicator may also embody multiple lamps for normal and abnormal condition indications and may also include audio indicators or a status recorder. These variations are deemed to be within the knowledge and skill of persons in the art.

The interval timer 46 may be selected to operate for any period. In practice, a 5-minute timer was used, however, the periodicity may be longer or shorter depending on the application and requirements of the system. For example, where individual bales of material are being checked for metal content by the detector, it would not be necessary to check the detector sensitivity more than once between bales. The separation of the bales on the conveyor and the speed of the conveyor could also determine how often a check should be made.

In the drawing, a manual test switch 64 is also shown. The purpose of this is so that an operator can manually effect a check of the detector sensitivity between intervals of the timer 46. Also shown is a bale sensor 66 that is normally close-circuited but is "opened" by a bale entering the detector zone so that a test may not be initiated during a normal detection sequence. LED 68 is provided to indicate that the test sequence is operating normally.

The benefits of the instant invention are apparent. First, the normal detection process is not interrupted by the action of the checking system. Second, all elements of the detection and indicating circuitry are utilized in the sensitivity check. Third, the performance checking sequence is simple and carried out by tried and proven components. And, finally, the system is fail-safe in that it not only provides a check for detector sensitivity but also indicates whether or not the checking system itself is operating normally.

While certain representative embodiments and details have been shown for the purpose of illustrating the invention, it will be apparent to those skilled in the art that various changes and modifications may be made therein without departing from the spirit or scope of the invention.

I claim:

1. In combination with an electromagnetic field variation detector including a field generator, a receiver for sensing variances in the field to provide detection signals conditioned to and indicative of a particular time duration of the variances in the field, and an alarm indicator responsive to the receiver to provide an indication indicative of the condition sensed, a sensitivity and performance checking system comprising:

(A) a normally open-circuited test coil within the province of the detector field to provide a variance in the field when close-circuited;

(B) a status indicator to provide an indication of the sensitivity and performance of the system; and (C) circuit means comprising:
  (1) a pulse generator for generating periodic pulses having a time duration substantially that of the field variation desired to be detected;
  (2) a driver circuit intercoupling the pulse generator and test coil to close-circuit the test coil in response to and for the duration of the pulse;
  (3) a flip-flop having set, output, and reset terminals, the set terminal connected to the pulse generator, the output terminal connected to the status indicator, and the reset terminal connected to the detector receiver, said flip-flop exhibiting a first stable state for holding the status indicator in a normal condition indication and a second stable state for holding the status indicator in an abnormal condition indication, said flip-flop adapted to being switched from its first stable state to its second stable state by a pulse from the pulse generator and switched back to its original stable state only by a conditioned detection signal from the detector receiver that is indicative of normal detector sensitivity and performance;
  (4) gating means coupled to shunt normal detector receiver signals to the alarm indicator when the test coil is open-circuited; and
  (5) a delay circuit intercoupling the driver circuit and gating means to close the gating means to the alarm indicator when the test coil is close-circuited such that the field variations due to the test coil and sensed by the detector receiver are sent to the flip-flop, said delay circuit holding the gating means closed for a duration long enough for the detector receiver to condition the signal and return to normal quiescence after which said gate is opened such that normal detection signals are again sent to the alarm indicator.

2. The system as set forth in claim 1, wherein the pulse generating means comprises a one-shot and an interval timer, said one-shot coupled to the timer to receive periodic energizing signals therefrom such that the one-shot provides output pulses at intervals as determined by the timer and of a duration as determined by the one-shot.

3. The system as set forth in claim 2, wherein the interval timer is coupled to the drive circuit such that a signal from the driver circuit that effects close-circuiting of the coil also resets the timer.

4. The system as set forth in claim 2, wherein a manual test switch is coupled into the one-shot to provide selective energization of the one-shot.

5. The system as set forth in claim 2, wherein the test coil energization is terminated at the end of the pulse provided by the one-shot whether or not the flip-flop is switched back to its original stable state.

6. A method for checking the sensitivity and performance of an electronic metal detector including an electromagnetic field generator, an alarm indicator, and a receiver for sensing the variations in the field to provide a detection signal to the alarm indicator indicative of a particular time duration of metal within the field; said method comprising the steps of:
   (1) positioning a normally open-circuited test coil within the province of the detector field;
   (2) providing a pulse signal to periodically close-circuit the test coil for the duration of the pulse, said duration simulating said particular duration of metal with the field, to effect a variation in the field that may be sensed by the receiver in the same manner as variations in the field due to metal;
   (3) providing a status indicator that is normally activated in a condition normal indication when the test coil is open-circuited and is deactivated when the test coil is close-circuited; and
   (4) gating the detection signal due to the close-circuited test coil to apparatus including a flip-flop circuit in a first stable state that holds the status indicator in a normal condition indication during the period when no check of the detector is being made, said pulse initiating a test by switching the flip-flop to an alternate stable state such that the status indicator is switched to an abnormal condition indication, said flip-flop coupled to receive the conditioned detection signal due to the test coil such that it is switched to its original stable state only upon receiving a properly conditioned detection signal.

7. The method as set forth in claim 6, wherein normal detection signals due to the presence of metal within the field are gated to the alarm indicator while the test coil is open-circuited but are inhibited when the test coil is close-circuited.

8. The method as set forth in claim 7, wherein the test coil energization is deactivated by the one-shot pulse termination whether or not the signal gated back to the flip-flop switches it back to is original stable state.

* * * * *